Oct. 21, 1969 W. ELLERMEYER 3,474,349

FAST ACTING ELECTRONIC FILTER

Filed Feb. 17, 1967

INVENTOR.
WALTER ELLERMEYER
BY J. Peter Mohn
AGENT
ATTORNEYS

United States Patent Office 3,474,349
Patented Oct. 21, 1969

3,474,349
FAST ACTING ELECTRONIC FILTER
Walter Ellermeyer, San Diego, Calif., assignor to the United States of America as represented by the Secretary of the Navy
Filed Feb. 17, 1967, Ser. No. 617,782
Int. Cl. H03f 1/36
U.S. Cl. 330—99 2 Claims

ABSTRACT OF THE DISCLOSURE

An improvement for filtering type operational amplifiers for minimizing the time necessary for the output of the amplifier to reach its steady state condition after the application of an input voltage. A shunting circuit is provided in parallel with the input resistance of the operational amplifier and arranged to effectively reduce the input impedance for a short time after an initial input voltage is applied. The amplifier therefor has an initial high gain which permits it to reach its steady state value in the desired shortened time.

The invention described herein may be manufactured and used by or for the Government of the United States of America for governmental purposes without the payment of any royalities thereon or therefor.

BACKGROUND OF THE INVENTION

This invention relates to operational amplifiers and more particularly to those operational amplifiers arranged to filter undesired alternating currents from a desired direct current signal.

Operational amplifiers are well known in the prior art. In general they comprise a high gain amplifier with serially arranged input resistance and a feedback resistance. The operation is such that the overall gain of the operational amplifier is dependent only on the ratio of the feedback resistance to the input resistance. If a capacitance is placed in parallel with the feedback resistance the operational amplifier may be used to filter undesired AC components from desired DC signals. Such operational amplifiers as the latter are particularly useful in instrumentation systems and more particularly as driver amplifiers for DC metering devices. In the latter application it is important that undesired AC components be prevented from effecting the ultimate meter reading. Filtering operational amplifiers are commonly used in most present-day digital voltmeters.

The effect of adding a capacitance in parallel with the feedback resistance of the operational amplifier is to increase the time necessary for the output of the amplifier to reach its steady state DC level after an input voltage is applied. When low frequency alternating currents are being filtered, the value of the capacitance used is sufficiently large that a time delay on the order of 20 seconds may result. It is therefore desirable to improve such filtering operational amplifiers to minimize their time response. Various techniques have been used to minimize the noted time delay in the prior art. One such technique is that used by Electronic Associates, Inc. in its digital voltmeters. The latter circuit essentially comprises a pair of operational amplifiers in a cascaded arrangement. Both of the amplifiers is provided with a filtering capacitor in its feedback loop but the capacitor in the first stage is small enough that rise time at the output of the first amplifier is relatively short. An arrangement is then provided for subjecting the second amplifier with an initially large input voltage for accelerating the charging of the capacitor in its feedback loop and consequently minimizing its time response. The latter circuit requires two operational amplifiers, which are costly items, and its time response, although improved, is still undesirable for certain applications. Furthermore, any errors in the operational amplifiers of the Electronic Associates' arrangement are cumulative since the two stages are connected in a cascade manner. To avoid any large errors, each amplifier must therefore be extremely accurate and consequently of high quality. The circuit of the present invention is capable of higher speed operation than the noted prior art and is significantly less expensive to construct since it only requires one high quality operational amplifier.

SUMMARY

The present invention overcomes the inadequacies of the prior art by providing the conventional operational amplifier with additional circuitry in a straightforward and simple manner. In particular, a shunting circuit is connected in parallel with the input resistance of the operational amplifier for decerasing the effective value of said resistance for a short initial time period when an input voltage is received. In its most elementary form the shunting circuit comprises a serially arranged capacitance and resistance. For increased effectiveness and versatility however, the shunting circuit preferably comprises a non-inverting summing amplifier in addition to the capacitance and resistance. One of the amplifier's inputs is provided with a portion of any voltage at its output, with the other of its inputs being connected to the input terminal of the composite operational amplifier. The series arranged capacitance and resistance are then connected between the summing amplifier output and the other side of the input resistance. In either embodiment the capacitor functions to permit the input impedance of the operational amplifier to be decreased by the shunting circuit until the capacitance is charged. With decreased input impedance the gain of the operational amplifier is increased, thus permitting the filter capacitor in its feedback path to be charged to its steady-state value in a shorter time period.

An object of this invention therefore is to improve the time response of a filtering operational amplifier.

A more particular object of this invention is to modify an operational amplifier used for removing an undesired alternating-current signal from a desired direct-current signal in such a manner that the output of the operational amplifier reaches its steady state DC level in a short time period.

The above and other objects and features of this invention will be better understood from the ensuing detailed description and drawings wherein.

Figure 1:
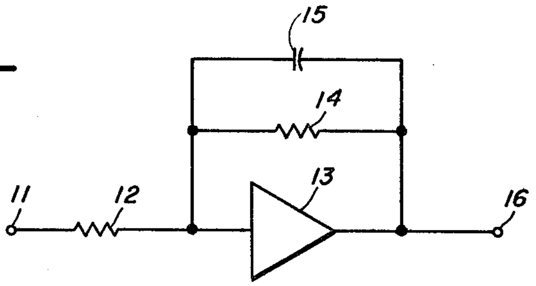
FIG. 1 (PRIOR ART)
FIG. 1 is a schematic diagram of a conventional filtering operational amplifier.

For ease in understanding the present invention, the operation of the conventional prior art filtering amplifier should be examined. Referring now to FIG. 1 it may be noted that such a prior art amplifier comprises an input terminal 11, an input resistance 12, a high gain DC amplifier 13, feedback resistance 14, filtering capacitance 15 and finally an output terminal 16. The amplifier 13 produces signals at its output which are 180° out of phase with those at its input and consequently shunt-connected feedback resistance 14 provides the amplifier with a degenerative feedback signal. The input impedance of the DC amplifier 13 is very high and ideally assumed to be infinite. As is well known in the art, the operation of the composite circuit is such that the overall gain between input terminal 11 and output terminal 16 is dependent on the ratio of feedback resistance 14 to input resistance 12.

The addition of a capacitance 15 as shown in FIG. 1 arranged in parallel with the feedback resistance 14 causes the circuit to operate as a filter and consequently to produce DC signals at output terminal 16 which are substantially free from any undesired AC components which are contained in input signals at terminal 11. When the AC components which are to be removed are of relatively low frequency, such as 60 cycles per second, the value of capacitance 15 is substantial. As noted previously the effect of such a substantial capacitance being connected to the output terminal is to delay the time necessary for a DC signal at the output terminal to reach its steady state value. The delay results from the charging time necessary to charge the capacitor 15.

Figure 2:
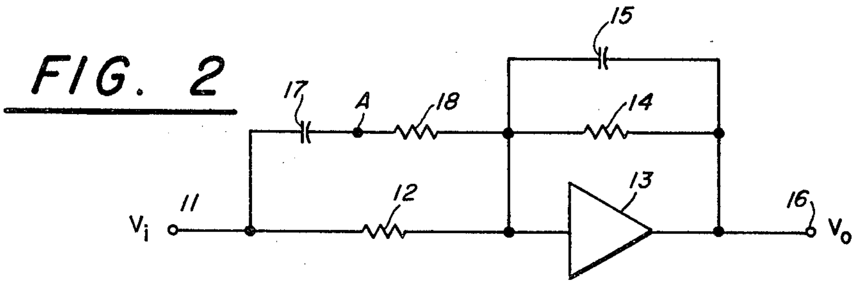
FIG. 2 is a schematic diagram of a basic embodiment of the present invention.

Referring now to FIG. 2 the most elementary form of the instant invention is shown. It should be noted that in each of the figures of the drawings, similar numerals have been used to indicate similar components. The embodiment of the invention shown in FIG. 2 differs from the prior art circuit of FIG. 1 by the addition of a capacitance 17 and a resistance 18. The serial combination of capacitance 17 and resistance 18 is connected in parallel with input resistance 12. It has been found that the value of the capacitance 17 must be substantially equal to the value of capacitance 15 for maximum results, i.e., minimum rise time at the output of the circuit.

For an understanding of the operation of the embodiment of FIG. 2, the easiest approach is to consider the voltages present at various points in the circuit during its operation. In this regard, all voltages noted are with respect to some common point such as ground. Assume initially that all voltages in the circuit are at 0 and a DC signal $V_i$ is then applied. Initially, the voltage at point A will be substantially equal to $V_i$ since capacitor 17 has a finite charging time. Because of the high input impedance of the DC amplifier 13, the combination of resistances 12 and 18 and DC amplifier 13 operate as an adder. The output voltage $V_o$ is therefore effected by $V_i$ and the voltage at point A, which initially equals $V_i$. The effect is proportional once again to the ratios of the feedback resistance 14 to the input resistances 12 and 18. Resistance 18 is chosen to have a relatively small value so that effective gain through that part of the circuit is relatively high. The net result is that a larger magnitude signal will appear at terminal 16 initially and the time for capacitance 15 to reach its desired steady state charge will be diminished. Capacitance 17 will eventually charge to the input voltage $V_i$ thereby causing the voltage at point A to approach zero and consequently have no effect on the final output voltage at terminal 16. The net result is that the voltage at terminal 16 $V_o$ reaches its steady state value in a substantially shorter time than is possible with the circuit of FIG. 1.

The circuit of FIG. 2 is subject to various disadvantages however. As noted previously, it has been found that capacitances 15 and 17 must be substantially equal for maximum results. When using capacitors with the values that are necessary for filtering low frequency AC components, tolerances are wide and it is sometimes difficult to obtain two capacitors that are well matched. Furthermore, the circuit of FIG. 2 is suitable only for use with signals from a low impedance source.

Figure 3:
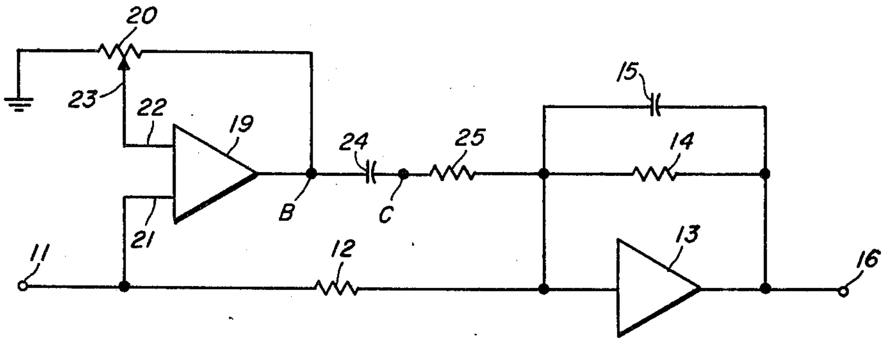
FIG. 3 is a schematic diagram of the preferred embodiment of the present invention.

The circuit of FIG. 3 is the preferred embodiment of the present invention and obviates the disadvantages noted with respect to the circuit of FIG. 2 by addition of a non-inverting differential amplifier 19 and a potentiometer 20. Differential amplifier 19 has first and second inputs 21 and 22, respectively, and is arranged to produce an output signal proportional to differences in value between signals at its input. Input 21 is connected to the input terminal 11 of the composite circuit and input 22 is connected to the variable tap 23 of the potentiometer 20. By adjusting tap 23, the voltage at input 22 may be set to any fraction of the voltage of the output of the amplifier 19 since potentiometer 20 is connected to the latter output, which has been designated as point B in FIG. 3. The differential amplifier and potentiometer function so that by adjusting tap 23 the voltage at point B may be set to any desired value. A capacitance 24 and resistance 25 serially connected between the output of amplifier 19 and the input of the DC amplifier 13. Capacitance 24 and resistance 25 are analogous to capacitance 17 and resistance 18 in the circuit of FIG. 2. Point C in FIG. 3 is therefore analagous to point A of FIG. 2 and operation of the circuit proceeds in the same manner as described in relation to FIG. 2. The only exception is that with embodiment of FIG. 3 the provision of a variable voltage source permits the circuit to be readily adjusted for minimum time response. Furthermore, amplifier 19 provides isolation between the input terminal 11 and capacitors 24 and permits the circuits to be used with signals from a high impedance source. In actual operation, the tap 23 of potentiometer 20 is merely adjusted until a point is found at which the overall circuit has its minimum time response, i.e., the output reaches its steady state condition in the shortest time interval.

Unlike other high speed filtering amplifier circuits noted previously, the circuit of this invention requires only a single high-quality DC amplifier for accurate results. The differential amplifier 19 need not be of high quality since at a time when capacitor 24 becomes charged, amplifier 19 has no effect on the voltage at output terminal 16.

In one circuit built in accordance with this invention, the time necessary for the output to reach its steady state condition was reduced from twenty seconds to one second by the addition of the shunting circuit to the input resistance.

Although the operation of the circuit was described in terms of its function as an adder initially, the operation may be approached from another standpoint. Effectively, the components added, as shown in the various embodiments of the invention, to the basic filtering operational amplifier of the prior art function to reduce the effective input impedance of the amplifier for some initial time period. Since the gains of the operational amplifier are proportional to the ratio of the feedback resistance to the input resistance, with reduced input resistances gains will obviously be higher. This invention basically comprises, therefore, a simple means for increasing the gain of an operational amplifier so it reaches its steady state value in a shorter period of time and reducing the gain to its desired value after the desired output is reached.

Although this invention has been shown and described in relation to two specific embodiments thereof it should not be limited thereto for various changes and modifications could be made by one with ordinary skill in the art without departing from the spirit and scope of this invention as defined in the following claims.

I claim:

1. In a filtering operational amplifier, for removing undesired AC signals from a desired DC signal, of the type comprising;

an inverting DC amplifier having an input and an output, a feedback path connected between said amplifier output and input and comprising a first resistance and a first capacitance connected in parallel, an input terminal for receiving signals to be filtered, an input resistance connected between said input terminal and said amplifier input, the voltage gain of said operational amplifier between said input terminal and said amplifier output being equal to the ratio of said first resistance to said input resistance, the improvement comprising, means for minimizing the response time of said operational amplifier and comprising, a non-inverting amplifier having two inputs and an output and arranged to produce a voltage at its output equal to the sum of any voltages at its inputs, means for supplying one of said non-inverting amplifier's two inputs with a portion of any voltage at its output, the other of said non-inverting amplifier's two inputs being connected to said input terminal, a serially-arranged third capacitance and third resistance connected between said non-inverting amplifier's output and said inverting amplifier's input.

2. The amplifier of claim 1 wherein said means for supplying one of said non-inverting amplifier's two inputs with a portion of any voltage at its output comprises;

a potentiometer connected between said latter output and a ground potential and having an adjustable tap, said tap being connected to said one of said two inputs.

References Cited

UNITED STATES PATENTS

| | | | |
|---|---|---|---|
| 2,584,386 | 2/1952 | Hare | 330—99 |
| 3,260,950 | 7/1966 | Saari | 330—99 X |

NATHAN KAUFMAN, Primary Examiner

U.S. Cl. X.R.

330—103